United States Patent
Lai et al.

(10) Patent No.: US 10,077,185 B2
(45) Date of Patent: Sep. 18, 2018

(54) MICRO NORMALLY-CLOSED STRUCTURE AND METHOD FOR MANUFACTURING THE SAME

(71) Applicant: National Tsing Hua University, Hsinchu (TW)

(72) Inventors: Wei-Cheng Lai, Hsinchu (TW); Weileun Fang, Hsinchu (TW)

(73) Assignee: National Tsing Hua University, Hsinchu (TW)

( * ) Notice: Subject to any disclaimer, the term of this patent is extended or adjusted under 35 U.S.C. 154(b) by 345 days.

(21) Appl. No.: 14/676,089

(22) Filed: Apr. 1, 2015

(65) Prior Publication Data

US 2015/0287556 A1 Oct. 8, 2015

(30) Foreign Application Priority Data

Apr. 3, 2014 (TW) .............................. 103112430 A

(51) Int. Cl.
*B81B 3/00* (2006.01)
*H01H 1/00* (2006.01)

(52) U.S. Cl.
CPC ...... *B81B 3/0056* (2013.01); *B81B 2201/014* (2013.01); *B81C 2203/032* (2013.01); *H01H 1/0036* (2013.01); *Y10T 29/49105* (2015.01)

(58) Field of Classification Search
CPC ................. B81B 3/0056; B81B 3/0059; Y10T 29/49105
See application file for complete search history.

(56) References Cited

U.S. PATENT DOCUMENTS

| 5,391,846 | A * | 2/1995 | Taylor | H01H 29/06 200/233 |
| 2002/0123176 | A1* | 9/2002 | Izumi | H01L 21/288 438/149 |
| 2012/0318648 | A1* | 12/2012 | Hall | H01H 11/00 200/181 |
| 2014/0166461 | A1* | 6/2014 | Goodnow | H01H 59/0009 200/600 |

* cited by examiner

*Primary Examiner* — Peter DungBa Vo
*Assistant Examiner* — Jeffrey Carley
(74) *Attorney, Agent, or Firm* — patenttm.us

(57) ABSTRACT

A method for manufacturing a micro normally-closed structure. The method includes steps of providing a flexible arm, and a stationary base and a fixed contact separated from the flexible arm, wherein the flexible arm is free to move and includes a first end configured at one terminal and a movable contact configured at another terminal, the transient base is configured at where corresponds to the first end, and the fixed contact is configured at where corresponds to the movable contact; forming a temporary electrical connection between the first end and the stationary base; forming a temporary electrical conduction between the movable contact and the fixed contact; maintaining the temporary electrical connection and the temporary electrical conduction; and securing the first end to the stationary base permanently which causes the temporary electrical connection turn into a permanent electrical connection and the temporary electrical conduction turn into the micro normally-closed structure.

7 Claims, 8 Drawing Sheets providing a substrate and a flexible arm, wherein the substrate includes a transient base and a fixed contact, the flexible arm includes a first end and a movable contact, wherein the position of the first end corresponds to the transient base, the position of the movable contact corresponds to the fixed contact
701 filling the transient base with a liquid metal to form an electrical connection between the first end and the transient base
702 optionally wiring the first end and the transient base to electrically connect the first end and the transient base
703 applying a gel layer to cover where the electrical connection is formed
704 applying an external magnetic field to move the flexible arm thereby enables the movable contact touches the fixed contact, to form an electrical conduction between the movable contact and the fixed contact
705 in this state, applying the UV radiation to solidify the gel layer to anchor the position of the first end corresponding to the transient base to maintain the electrical conduction, thus forming a micro normally-closed structure
706

Fig. 7 providing a substrate and a flexible arm, wherein the substrate includes a transient base and a fixed contact, the flexible arm includes a first end and a movable contact, wherein the position of the first end corresponds to the transient base, the position of the movable contact corresponds to the fixed contact
801 applying an external magnetic field to move the flexible arm thereby enables the movable contact touches the fixed contact, to form an electrical conduction between the movable contact and the fixed contact
802 filling the transient base with a liquid metal to form an electrical connection between the first end and the transient base
803 optionally wiring the first end and the transient base to electrically connect the first end and the transient base
804 anchoring the position of the first end corresponding to the transient base to maintain the electrical conduction, thus forming a micro normally-closed structure
805

Fig. 8

MICRO NORMALLY-CLOSED STRUCTURE AND METHOD FOR MANUFACTURING THE SAME

FIELD

The present invention refers to a micro normally-closed structure and manufacturing methods thereof, specifically a micro normally-closed structure and manufacturing methods of a micro normally closed reed switch or a micro normally closed relay which is manufactured by micro-electro mechanical systems (MEMS) processes.

BACKGROUND

Normally-open reed switches are typically passive electro mechanical components, principally used as electrical switches which has a basic structure of packing two reeds in a glass tube, two reeds are overlapping in position and separated by a small gap between the two reeds to form a opened state. When operating, imposing external magnetic field on the reeds to force both electrically conducting to form a closed state, and turning to the original open state when the external magnetic field disappeared. Reed switch is principally used to control the system circuit conducting situations, which must be high efficiency, high reliability, high accuracy and rapid response.

Various electrical and mechanical components, e.g. relays, solenoids, valves, sensors, inductance components, micro gear and other electro mechanical components, gradually develop towards miniaturization and low power that push the reed switches forward to miniaturization. The Micro Electro Mechanical Systems (MEMS) is the most mature technology in various miniaturizing manufacturing techniques that the electro mechanical component produced with MEMS methods has smaller volume and is able to configure diversity functions that is also push forward the research and development of the reed switch/micro relays with MEMS technology.

It is worth noting that the reed produced with the MEMS technology in the prior art principally designed as normally open structure, for the reason of the main steps of MEMS process, including photolithography, etching, doping, deposition, etc., is more suitable for forming a continued laminated structure, but many difficulties will be encountered when implementing said steps in producing a non-continuous open structure in interlayer and then forming a normally closed structure. For that reason, the micro reed switches with MEMS process currently designed as a normally open structure.

However, contrary to the normally open structure, there is a need for the normally closed structure, since the normally-closed reed switches including the normally closed structure are still widely used in many MEMS based applications or products. Therefore, the present invention provides a novel method for manufacturing a micro normally closed reed switches which can be simply produced by MEMS process.

SUMMARY

Since most of the conventional reed switches made by the MEMS techniques are the normally-open switches, in order to provide a simple method for manufacturing the normally-closed switches, the present invention provide a method for manufacturing a micro normally-closed reed switches which can be simply produced by the MEMS process.

The present invention provides a method of manufacturing a micro normally-closed structure. The method includes steps of: providing a flexible arm, a transient base and a fixed contact, wherein the flexible arm including a first end and a movable contact, wherein the position of the first end is corresponding to the transient base, and the position of the movable contacts is corresponding to the fixed contact; and generating an electrically conducting state between the movable contact and the fixed contact, in which the first end is anchored to the position of the transient base to remain the electrically conducting state.

The present invention further provides a method of manufacturing a micro normally-closed structure. The method includes: providing a flexible arm, a movable base and a fixed contact, wherein the flexible arm including a first end and a movable contact, the movable base provides an electrically movable connection to the first end, wherein the position of the movable contact is corresponding to the fixed contact; and generating an electrically conducting state between the movable contact and the fixed contact, in which anchoring the transient base to fix the first end to the position of the movable base to remain the electrically conducting state.

The present invention further provides a micro normally-closed structure, in which manufactured through a MEMS process and used as a MEMS component. The structure includes: a base and a fixed contact; and a flexible arm including a first end and a movable contact, wherein the first end is electrically connecting to the base, and remaining a normally closed electrically conducting state between the movable contact and the fix end.

DESCRIPTION OF THE DRAWINGS

A more complete appreciation of the invention and many of the attendant advantages thereof are readily obtained as the same become better understood by reference to the following detailed description when considered in connection with the accompanying drawing, wherein:

FIG. 7 is a flowchart showing steps in the first embodiment according to the present invention.

FIG. 8 is a flowchart showing steps in the second embodiment according to the present invention.

DETAILED DESCRIPTION

Figure 1:
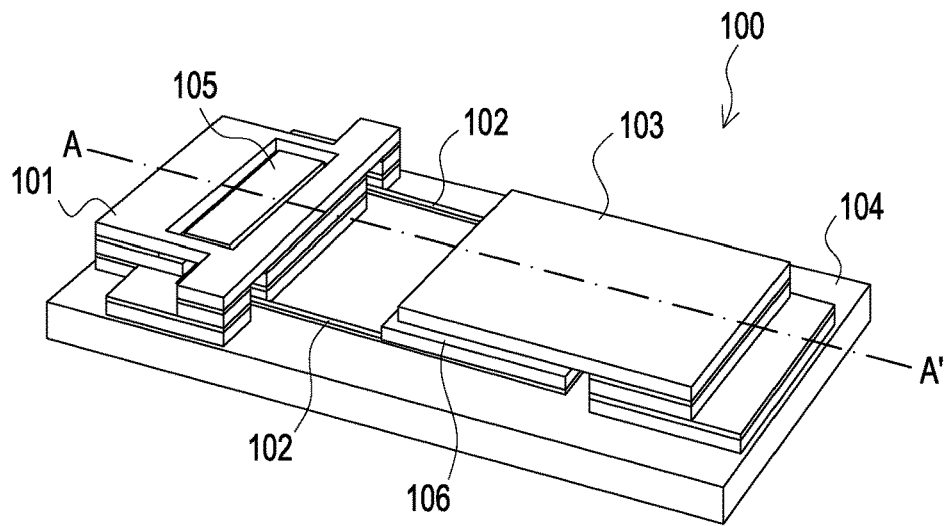
FIG. 1 is a schematic diagram showing an initial structure at an initial stage in the process manufacturing the micro normally-closed structure according to the present invention.

The present disclosure will be described with respect to particular embodiments and with reference to certain drawings, but the disclosure is not limited thereto but is only limited by the claims. The drawings described are only schematic and are non-limiting. In the drawings, the size of some of the elements may be exaggerated and not drawn on scale for illustrative purposes. The dimensions and the relative dimensions do not necessarily correspond to actual reductions to practice.

It is to be noticed that the term "including", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device including means A and B" should not be limited to devices consisting only of components A and B.

The disclosure will now be described by a detailed description of several embodiments. It is clear that other embodiments can be configured according to the knowledge of persons skilled in the art without departing from the true technical teaching of the present disclosure, the claimed disclosure being limited only by the terms of the appended claims.

First Embodiment

FIG. 1 is a schematic diagram showing an initial structure at an initial stage in the process manufacturing the micro normally-closed structure according to the present invention. In order to manufacture the micro normally-closed structure according to the present invention, it is needed to manufacture multiple essential components in advance by a semiconductor manufacturing process or a micro-electro mechanical (MEMS) process, which components construct the micro normally-closed structure. The micro structure 100 in FIG. 1 includes multiple components as follows: a transient base (movable base) 101, a flexible arm 102 and a fixed contact 103, wherein the flexible arm 102 has two ends which are the first end 105 and movable contact 106 respectively. During this stage in the process, the first end 105 of the flexible arm 102 is positioned in correspondence to where the transient base 101 is located to cause the first end 105 and the transient base 101 to be kept in contact with each other by a way of a movable contact, in which the relative positions are not yet fixed to one another. The movable contact 106 of the flexible arm 102 is positioned in correspondence to where the fixed contact 103 is located to cause both to be temporarily kept in separate or in non-contact with each other. In the present embodiment, the multiple components forming the above-mentioned micro structure 100 can be directly formed on the substrate 104 by a semiconductor process or a MEMS process, or pre-made in advance on a specific handle ring, and then is transferred to and fixed on the substrate 104. The substrate 104 is preferably a dielectric substrate.

Figure 2:
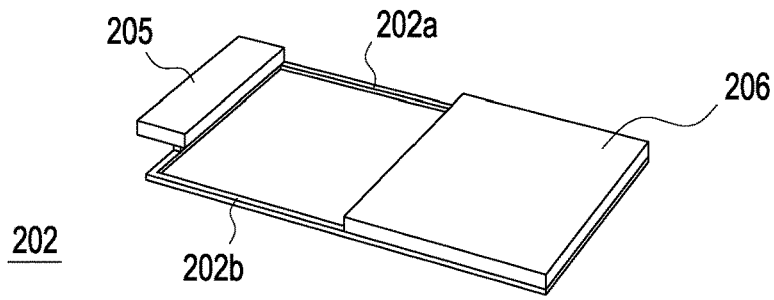
FIG. 2 is a schematic diagram showing the flexible arm structure according to the present invention.

FIG. 2 is a schematic diagram showing the flexible arm structure according to the present invention. In the embodiment, the flexible arm structure 202 is preferable to have a first end 205, a pair of flexible arms 202a and 202b which are symmetrically arranged, a movable contact 206 and so on. In some embodiments, the flexible arm 202 is preferably a reed or an elastic sheet (not shown in the figure), i.e., a flexible arm consists of an elastic sheet. On the ends of the elastic sheet are respectively the first end and the movable contact. In some embodiments, the flexible arm is preferably a single flexible arm, a flexible arm consists of a single flexible arm, has a first end and a movable contact.

Figure 3:
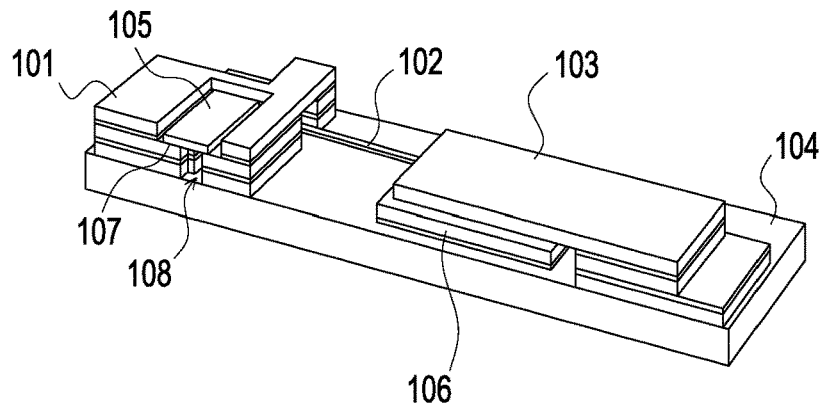
FIG. 3 is a perspective cross-section schematic diagram showing a cross-section partial structure of the micro structure along the dashed line AA' shown in FIG. 1.

FIG. 3 is a perspective cross-section schematic diagram showing a cross-section partial structure of the micro structure along the dashed line AA' shown in FIG. 1. In FIG. 3, the transient base 101 is preferably designed to have a supporting portion 107 and a gap 108, wherein the gap 108 provides a sufficient space to contain the first end 105 of flexible arm 102. The gap 108 allows the first end 105 of the flexible arm 102 to be movable after being disposed on the supporting portion 107. In some embodiments, the transient base 101 is preferably a movable component that can movably link the first end 105 of the flexible arm 102. In some embodiments, the transient base 101 is preferably a hinge, wherein the first end 105 of the flexible arm 102 movably and electrically connects with the transient base 101 through the hinge.

Figure 4:
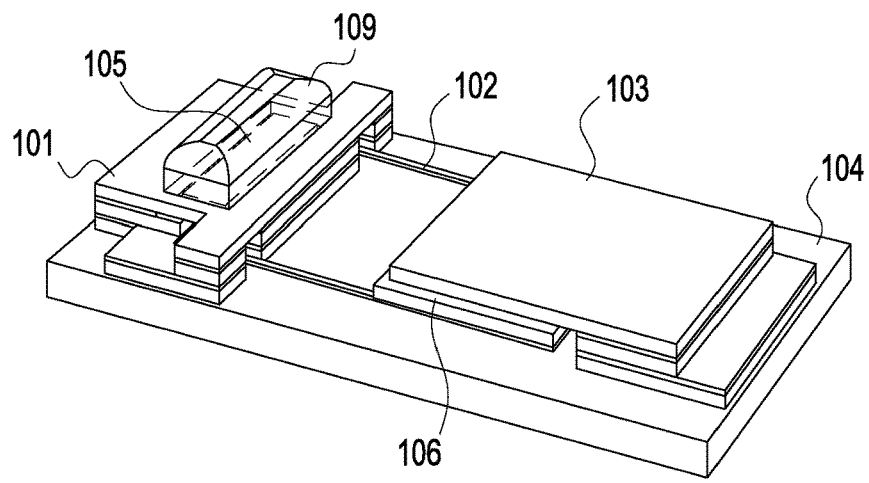
FIG. 4 is a schematic diagram showing a second middle structure at a second stage in the process manufacturing the micro normally-closed structure according to the present invention.

FIG. 4 is a schematic diagram showing a second middle structure at a second stage in the process manufacturing the micro normally-closed structure according to the present invention. In this stage, it is preferred to fill liquid metal 109 (for example, Galinstan or mercury) into the gap 108 of the transient base 101 to generate movably electrically connection between the first end 105 and the transient base 101 that causing the first end 105 and transient base 101 electrically conducted but remained movable, or wiring the first end 105 to the transient base 101 to also generate electrically connection between the first end 105 and the transient base 101 but remain movable.

Figure 5:
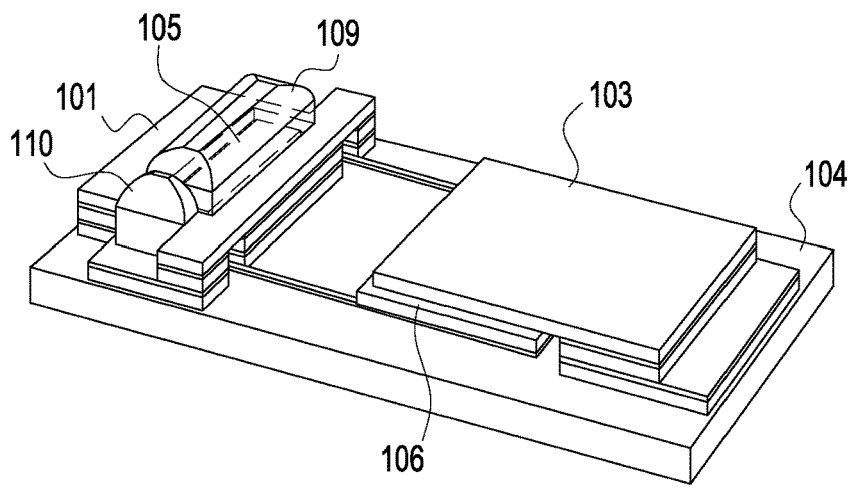
FIG. 5 is a schematic diagram showing a third middle structure at a third stage in the process manufacturing the micro normally-closed structure according to the present invention.

FIG. 5 is a schematic diagram showing a third middle structure at a third stage in the process manufacturing the micro normally-closed structure according to the present invention. In the previous stage, the first end 105 has properly movably electrically conducted to the transient base, so that this stage is to apply or dispense the UV-gel 110 on the overall structure of the first end 105 and the transient base 101 in advance, wherein preferably only have to dispense on the edge of both ends of the transient base 101. It is noteworthy that the overall structure of the first end 105 and the transient base 101 keeps movable after dispensing the gel that the gel dispensing stage does not affect the relative mobility of the first end 105 and the transient base 101. Notably, in the second stage, it can also apply a high temperature melting solder liquid to the gap 108 (not shown in FIG. 5) of the transient base 101 at high temperature, or coated the solder on the gap 108 (not shown in FIG. 5) of the transient base 101 in advance, and then re-melt it at high temperature, wherein the solder naturally solidified after the temperature dropped, so that it can achieve the fix effect without the gel dispensing steps.

Figure 6:
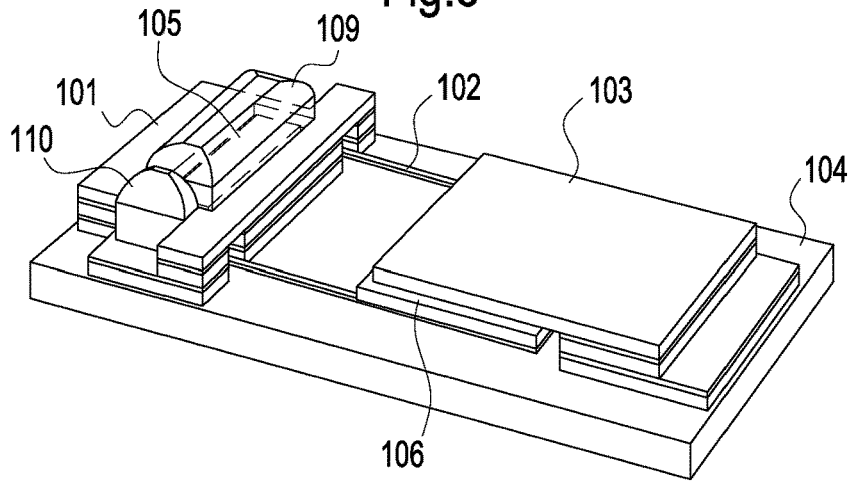
FIG. 6 is a schematic diagram showing a fourth middle structure at a fourth stage in the process manufacturing the micro normally-closed structure according to the present invention.

FIG. 6 is a schematic diagram showing a fourth middle structure at a fourth stage in the process manufacturing the micro normally-closed structure according to the present invention. Applying an external magnetic field on the flexible arm 102 in success to move the whole flexible arm 102, for example: lifting upward to generate an electrically conducting state between the movable contact 106 of the flexible arm 102 and the fixed contact 103; maintaining the electrically conducting state, while applying UV (Ultraviolet) radiation to the structure with UV-gel 110 until it was solidified, so that the position of the first end 105 corresponding to the transient base 101 is anchored, when the movable contact 106 and fixed contact 103 keep on electrically conducting, and remains constantly electrically conducting without external force which is a normally-closed state to completes the "micro normally-closed structure" production.

Reference to the disclosure of FIG. 1 to FIG. 6 in whole, the present invention utilizes the semiconductor processes or micro-electro mechanical (MEMS) process to form a transient base 101 on the substrate 104, a flexible arm 102, a fixed contact 103, a first end 105, a movable contact 106 and other basic components in advance, or assembling these basic components to certain stages and then transfer to the substrate 104 and fix. In this certain stages, the transient base 101 and the first end 105 remain movable, and fill liquid metal 109 into the transient base 101, or wiring the transient base 101 and first end 105; and then applying the UV-gel 110 to the transient base 101 that the transient base 101 and the first end 105 remain mutually movable at this stage; applying an external magnetic field to attract the flexible arm 102 upward, so that the movable contact 106 touches the fixed contact 103 to form the closed state, notably, the transient base 101 and the first end 105 remain mutually movable until this stage of process for the effect of the liquid metal 109 or the wire; and then applying UV radiation to solidify the UV-gel 110 to anchor the position of the first end 105 and the transient base 101, i.e., transferring the transient base 101 form movable to immovable to completely fix the whole flexible arm 102. Operationally applying an external magnetic force to the position near by the movable contact 106 of the flexible arm 102, so that mutually separate the normally closed movable contact 106 and the fixed contact 103 to form an operating open state.

FIG. 7 is a flowchart showing steps in the first embodiment according to the present invention. The present micro normally-closed structure manufacturing methods includes steps of: step 701, providing a substrate and a flexible arm, wherein the substrate includes a transient base and a fixed contact, the flexible arm includes a first end and a movable contact, wherein the position of the first end corresponds to the transient base, the position of the movable contact corresponds to the fixed contact; step 702, selectively filling a liquid metal to the transient base to electrically conduct the first end and the transient base; step 703, selectively wiring the first end and the transient base to electrically conduct the first end and the transient base; step 704, selectively applying a photosensitive gel to the transient base filled with the liquid metal; step 705, applying an external magnetic field to move the flexible arm thereby enables the movable contact touches the fixed contact, so that generating an electrically conducting state between the movable contact and the fixed contact; and step 706, in this state, applying the UV radiation to solidify the photosensitive gel to anchor the position of the first end corresponding to the transient base to hold the electrically conducting state, thus forming a micro normally-closed structure.

Second Embodiment

Refer to FIG. 3, in the present second embodiment, after completing the microstructure disclosed in FIG. 3, directly applying the external magnetic field to the flexible arm 102 in FIG. 3 to move the whole flexible arm 102, for example: lifting upward to generate an electrically conducting state between the movable contact 106 of the flexible arm 102 and the fixed contact 103, maintaining the electrically conducting state, while filling the liquid metal 109 to the gap 108 of the transient base 101 or wiring the first end 105 and the transient base 101, and then implement fixing means to the first end 105 and the transient base 101, for example, anchoring the position of the first end 105 corresponding to the transient base 101 by thermo-curing gel, or implement other means which are able to anchor the position of the first end 105 corresponding to the transient base 101, meanwhile, the movable contact 106 and the fixed contact 103 keep on electrically conducting, and remains constantly electrically conducting without external force which is a normally-closed state; and then electrically conducting the first end 105 and the transient base 101, for example, wiring the first end 105 and the transient base 101, to completes the "micro normally-closed structure" production.

FIG. 8 is a flowchart showing steps in the second embodiment according to the present invention. The present micro normally-closed structure manufacturing methods includes steps of: step 801, providing a substrate and a flexible arm, wherein the substrate includes a transient base and a fixed contact, the flexible arm includes a first end and a movable contact, wherein the position of the first end corresponds to the transient base, the position of the movable contact corresponds to the fixed contact; step 802, applying an external magnetic field to move the flexible arm thereby enables the movable contact touches the fixed contact, so that generating an electrically conducting state between the movable contact and the fixed contact; step 803, selectively filling a liquid metal to the transient base to electrically conduct the first end and the transient base; step 804, selectively wiring the first end and the transient base to electrically conduct the first end and the transient base; and step 805, anchoring the position of the first end corresponding to the transient base to hold the electrically conducting state, thus forming a micro normally-closed structure.

Third Embodiment

Refer to FIG. 3, in this third embodiment, when completing the micro structure disclosed in FIG. 3, selectively directly apply the external magnetic field to the flexible arm 102 in FIG. 3 to move the whole flexible arm 102, for example: lifting upward to generate an electrically conducting state between the movable contact 106 of the flexible arm 102 and the fixed contact 103,maintaining the electrically conducting state, while applying fixing means to the first end 105 and the transient base 101, for example, anchoring the position of the first end 105 corresponding to the transient base 101 by thermo-curing gel, or implement other means which are able to anchor the position of the first end 105 corresponding to the transient base 101, meanwhile, the movable contact 106 and the fixed contact 103 keep on electrically conducting, and remains constantly electrically conducting without external force which is a normally-closed state; and then electrically conducting the first end 105 and the transient base 101, for example, wiring the first end 105 and the transient base 101, to completes the "micro normally-closed structure" production.

Figure 9:
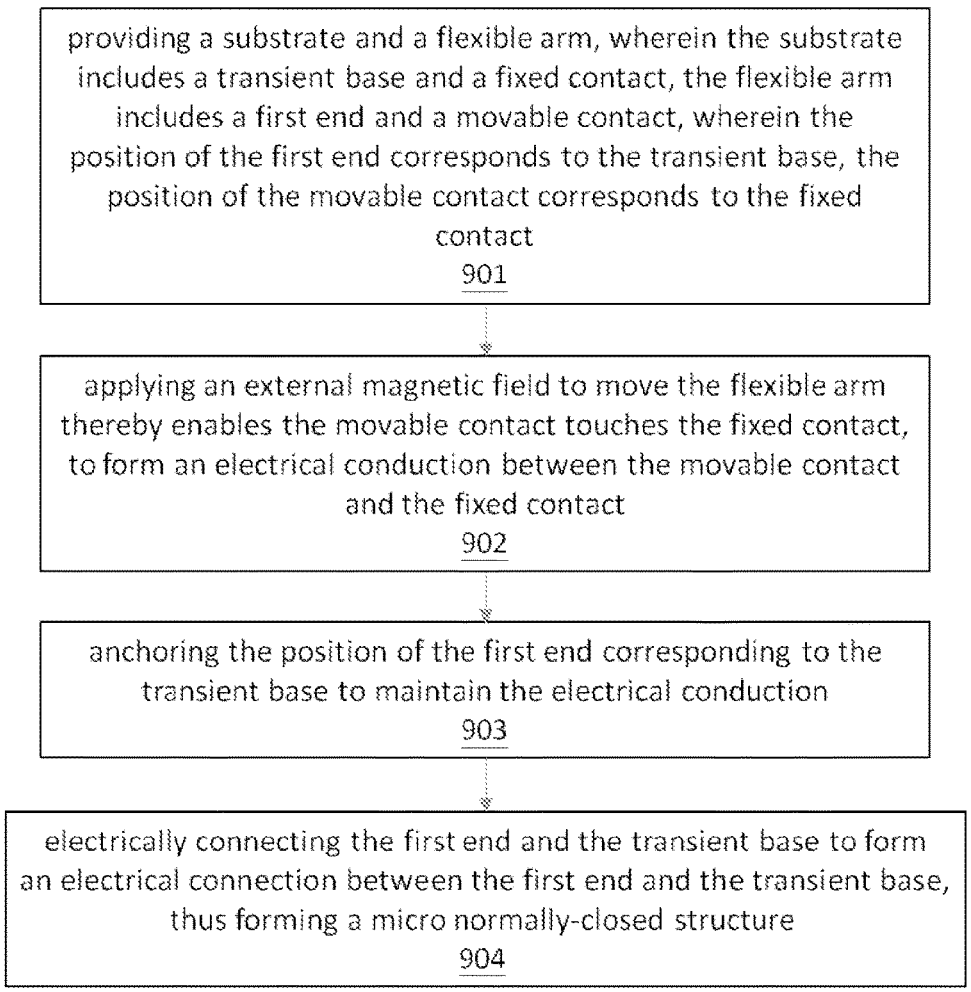
FIG. 9 is a flowchart showing steps in the third embodiment according to the present invention.

FIG. 9 is a flowchart showing steps in the third embodiment according to the present invention. The present micro normally-closed structure manufacturing methods includes steps of: Step 901, providing a substrate and a flexible arm, wherein the substrate includes a transient base and a fixed contact, the flexible arm includes a first end and a movable contact, wherein the position of the first end corresponds to the transient base, the position of the movable contact corresponds to the fixed contact; step 902, applying an external magnetic field to move the flexible arm thereby enables the movable contact touches the fixed contact, so that generating an electrically conducting state between the movable contact and the fixed contact; step 903, anchoring the position of the first end corresponding to the transient base to hold the electrically conducting state; step 904, electrically connecting the first end and the transient base to generate the electrically conducting state between the first end and the transient base, thus forming a micro normally-closed structure.

Figure 10A:
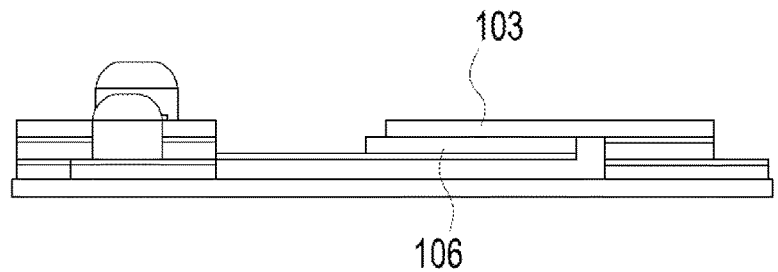
FIG. 10(a) is a schematic diagram showing a closed state of the micro normally-closed structure during a no-operation period according to the present invention.
Figure 10B:
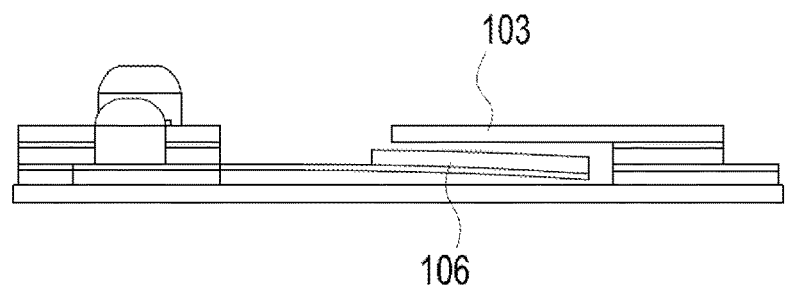
FIG. 10(b) is a schematic diagram showing an opened state of the micro normally-closed structure caused by an external magnetic field during an operation period according to the present invention.

FIG. 10(a) is a schematic diagram showing a closed state of the micro normally-closed structure during a no-operation period according to the present invention, and FIG. 10(b) is a schematic diagram showing an opened state of the micro normally-closed structure caused by an external magnetic field during an operation period according to the present invention. During a no-operation state, both the movable contact 106 and the fixed contact 103 on the micro normally-closed structure constantly switch on to keep both components being in an electrical connection with each other, as shown in FIG. 10(a). During an operation state, as long as if an external magnetic field is applied to an neighboring area in proximity to the movable contact 106, the movable contact 106 is attracted by the external magnetic force which causes both the movable contact 106 and the fixed contact 103 on the micro normally-closed structure to be temporarily separated and switched off, as shown in FIG. 10(b). Until the external magnetic field disappears, the movable contact 106 and the fixed contact 103 then return to the closed state as shown in FIG. 10(a).

Figure 11A:
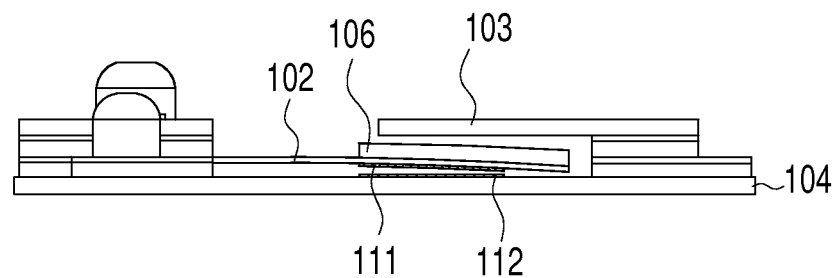
FIG. 11(a) is a schematic diagram illustrating an opened state of the micro normally-closed structure caused by an electrostatic actuating force during an operation period according to the present invention.
Figure 11B:
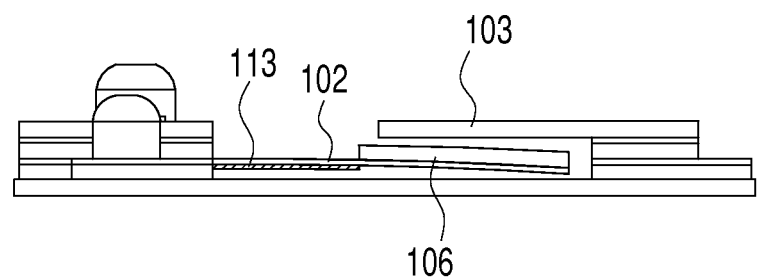
FIG. 11(b) is a schematic diagram illustrating an opened state of the micro normally-closed structure caused by a thermal actuating force during an operation period according to the present invention

FIG. 11(a) is a schematic diagram illustrating an opened state of the micro normally-closed structure caused by an electrostatic actuating force during an operation period according to the present invention. FIG. 11(b) is a schematic diagram illustrating an opened state of the micro normally-closed structure caused by a thermal actuating force during an operation period according to the present invention. In order to switch off the movable contact 106 and the fixed contact 103, there exist multiple schemes available to cause the movable contact 106 to be moved to temporarily separate from the fixed contact 103 in addition to the above-mentioned scheme based on the external magnetic field.

In one embodiment, an electrostatic scheme based on an electrostatic actuating force is introduced. As shown in FIG. 11(a), a pair of electrostatic driving electrodes 111 and 112 is configured on the bottom side of movable contact 106 and the top side of substrate 104 respectively, for example. While a voltage difference is applied between the electrodes 111 and 112, an electrostatic attractive force is consequently generated therebetween to cause the movable contact 106 to be attracted by and to move toward the electrode 112, whereby the movable contact 106 and the fixed contact 103 are separated from each other and switched off.

In one embodiment, a thermal scheme based on a thermal actuating force is introduced. As shown in FIG. 11(b), a thermal driving actuator 113 is configured underneath the flexible arm 102. While an electrical current is applied to the thermal actuating actuator 113, the actuator 113 generates a downward bending force to drive the flexible arm 102 to be bended downwardly, whereby the movable contact 106 and the fixed contact 103 are separated from each other and switched off. Usually the actuator 113 simply consists of two layers of metal-based materials, which have respective thermal expansion coefficient different from each other. Thus when the electrical current is applied to the actuator 113, the actuator 113 bends the flexible arm 102 to cause the movable contact 106 to separate from the fixed contact 103, due to a compression force or a tension force between two layers of materials having different thermal expansion coefficients respectively.

The micro normally-closed structure of the present invention can be used as a micro normally-closed reed switch or a micro relay.

The flexible arm of the present invention is preferably constituted by a material such as nickel or iron, the flexibility and rigidity of the entire flexible arm is adjustable, and the rigidity of the entire micro normally-closed structure can be adjusted by gel dispensing. The surface of the movable contact and the fixed contact is usually further enhanced treated, for example: rhodium coating, gold coating, etc., in order to avoid frequently switching or a large current pass through to form damage/defect on the contact surface and so on.

Liquid metal used in the present invention is preferably Galinstan, which is composed of different ratio of gallium, indium and tin, which can withstand low temperature to around minus 10 degrees. It does not need to fill too much liquid metal to the transient base, as long as it can form the electrically conduction between the transient base and the first end. It also does not need to fill too much UV radiation sensitive gel, as long as it can properly fix the transient base and provide sufficient flexibility and leverage.

To generate a movable electrically conduction between the first end and the transient base, it can not only utilize the way of filling liquid metal, but also can utilize the way of metal wire. Any means which can generate movable electrically conduction between the first end and the transient base will be possible, as long as it can remain the first end and the transient base movable before the dispensed UV radiation sensitive gel is not solidified.

Figure 12:
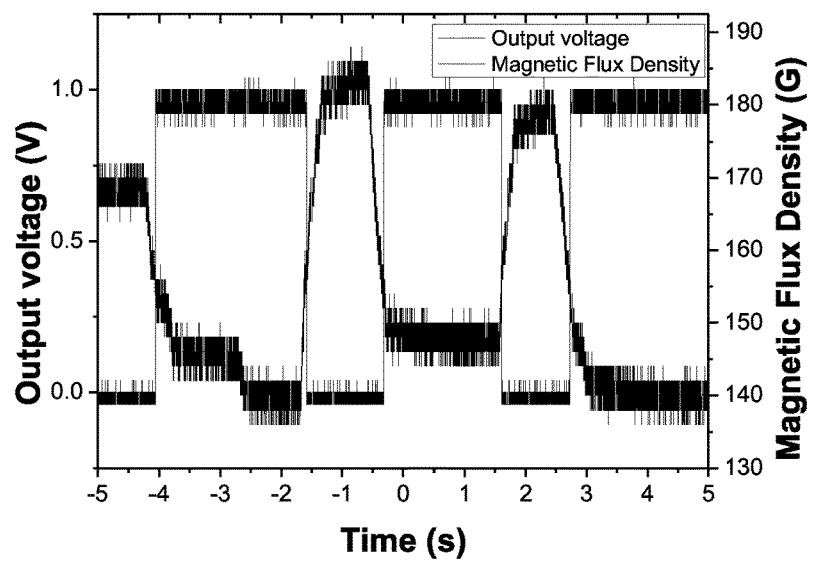
FIG. 12 is a schematic diagram showing the working voltage (V) and magnetic flux density (G) with respect to time (T) which is an actual test result to the micro normally-closed structure according to the present invention.

FIG. 12 is a schematic diagram showing the working voltage (V) and magnetic flux density (G) with respect to time (T) which is an actual test result to the micro normally-closed structure according to the present invention. From FIG. 12, when the applied external magnetic field is higher than 165 gauss the magnetic flux density, the micro normally-closed structure will enter the operational opened state, while the working voltage is 0; when the applied external magnetic field is lower than 145 gauss the magnetic flux density, the micro normally-closed structure will return to the normally-closed state, while the working voltage comes to the normal working voltage. From the aforementioned real test, the micro normally-closed structure can be well controlled and modulated through the external magnetic field, wherein the real tested contact resistance between the movable contact and the fixed contact is about 0.2Ω to 5Ω.

Figure 13:
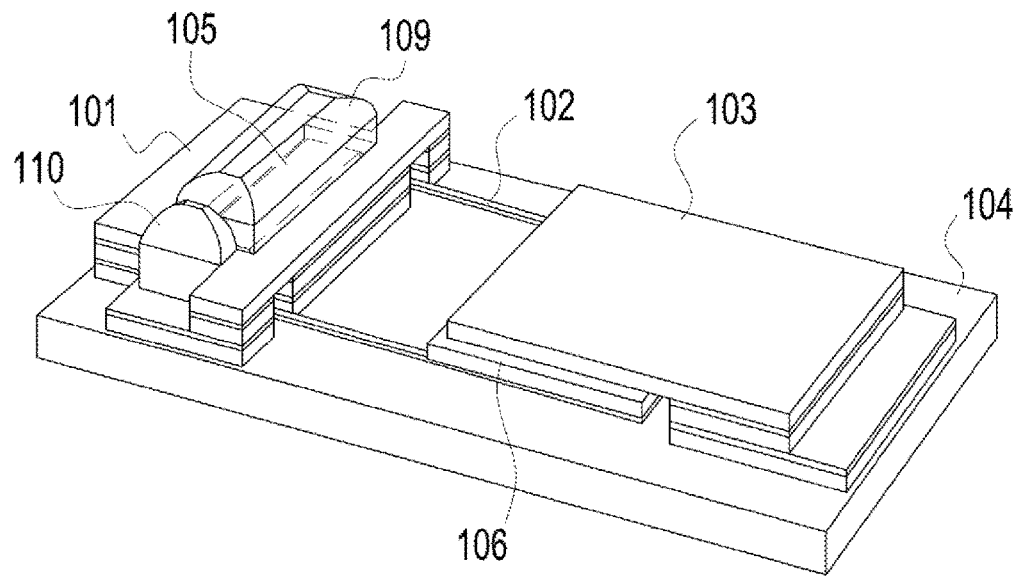
FIG. 13 is a schematic diagram showing the final finished micro normally-closed structure made by the micro normally-closed structure manufacturing method according to the present invention.

FIG. 13 is a schematic diagram showing the final finished micro normally-closed structure made by the micro normally-closed structure manufacturing method according to the present invention. The micro normally-closed structure 500 disclosed in FIG. 12 shows the eventual products of accomplishing the micro normally-closed structure manufacturing methods which is mainly manufactured on the basis of the MEMS process and a MEMS component, in which the micro normally-closed structure 500 includes a base 501, flexible arm 502 and a fixed contact 503, wherein the flexible arm 502 includes a first end 505 and a movable contact 506, the first end 505 electrically connects to base 501, the movable contact 506 and fixed contact 503 remain normally closed conducting and the eventual micro normally-closed structure 500 is formed on the substrate 504 which is preferable a dielectric substrate.

Figure 14:
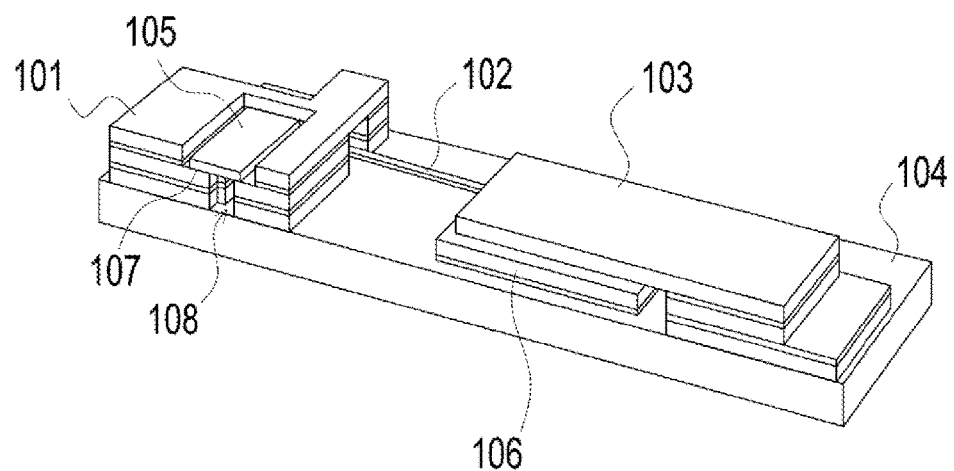
FIG. 14 is a schematic diagram showing a transitional structure in the micro normally-closed structure manufacturing method according to the present invention.

FIG. 14 is a schematic diagram showing a transitional structure in the micro normally-closed structure manufacturing method according to the present invention. The transitional structure 600 is a key provisional structure generated in the process of implementing the micro normally-closed structure manufacturing methods which is mainly manufactured on the basis of the MEMS process and a MEMS component. The transitional structure 600 includes a flexible arm 602, a movable base 601 and a fixed contact 603, wherein the flexible arm 602 includes a first end 605 and a movable contact 606, the movable base 601 provide a movably electrical connection for the first end 605, the movable contact 606 and the fixed end 603 are at open circuit state and the transitional structure 600 is formed on the substrate 604 which is preferable a dielectric substrate.

The micro normally-closed structure of the present invention can be specifically used as a micro normally-closed switch which extensively applying in the field of medical apparatus, for example: micro fluidic chips, artificial cardiac pacemaker, hearing aids, capsule stomach endoscopy; applying in the field of micro automatic control, for example: micro fluidic control, micro-electro mechanical control, etc.; applying in the field of mobile devices, for example: laptop, tablet, smart phone, etc.; applying in the field of health products, for example: electric reels, pedometer, etc.; applying in the field of automotive, for example: sensors of carburetor, engine oil cooler, fuel tank liquid volume, brake oil level, windshield washer, etc.; applying in the field of security, for example: window type sensors; applying in the field of household appliance, for example: water heater stream sensor, water meter, electric meter, etc.; the micro normally-closed switch is a essential key component of the apparatuses in the aforementioned fields.

The process of manufacturing the micro normally-closed structure proposed in the present invention is not complicated, and the enforced process steps are standard process of the present semiconductor manufacturing process, so that it is not difficult to mass produce on the production line which is compatible to the present semiconductor manufacturing process, and the materials used in the present invention is also obtainable in the present semiconductor manufacturing process. For that reason, the material cost of the present invention is relatively low and the structure of that is simple and easy to produce which is highly industrial applicable.

There are further embodiments provided as follows.

Embodiment 1: A method of manufacturing a micro normally-closed structure, includes: providing a flexible arm, a transient base and a fixed contact, wherein the flexible arm including a first end and a movable contact, wherein the position of the first end is corresponding to the transient base, and the position of the movable contacts is corresponding to the fixed contact; and generating an electrically conducting state between the movable contact and the fixed contact, in which the first end is anchored to the position of the transient base to remain the electrically conducting state.

Embodiment 2: The manufacturing method of Embodiment 1, further includes one of the steps of: selectively filling a liquid metal to the transient base to generate an electrically conducting state between the first end and the transient base, and applying an photosensitive gel to the transient base filled with the liquid metal; selectively wiring the first end and the transient base to electrically conduct the first end and the transient base, and applying an photosensitive gel to the wired transient base; applying an external magnetic field to the flexible arm to move the flexible arm to make the movable contact touching the fixed contact to generate the electrically conductive state; and applying an ultraviolet radiation to solidify the photosensitive gel to anchor the first end to the corresponding position of the transient base.

Embodiment 3: The manufacturing method of Embodiment 1, further includes one of the steps of: applying an external magnetic field to the flexible arm to move the flexible arm to make the movable contact touching the fixed contact to generate the electrically conducting state; selectively filling a liquid metal to the transient base to generate an electrically conducting state between the first end and the transient base, and applying a gel layer to the transient base filled with the liquid metal; selectively wiring the first end and the transient base to electrically conduct the first end and the transient base, and applying a gel layer to the wired transient base; and holding the electrically conducting state and solidifying the gel layer to anchor the first end to the corresponding position of the transient base.

Embodiment 4: The manufacturing method of Embodiment 1, further includes one of the steps of: applying an external magnetic field to the flexible arm to move the flexible arm to make the movable contact touching the fixed contact to generate the electrically conducting state; holding the electrically conducting state and anchoring the first end to the corresponding position of the transient base; selectively filling a liquid metal to the transient base to generate an electrically conducting state between the first end and the transient base; and selectively wiring the first end and the transient base to electrically conduct the first end and the transient base.

Embodiment 5: The manufacturing method of Embodiment 2, 3 or 4, the liquid metal is a Galinstan or a mercury, wherein the Galinstan is composed of the unequal proportion of gallium, indium and tin.

Embodiment 6: The manufacturing method of Embodiment 2 or 3, the photosensitive gel is an ultraviolet radiation sensitive gel or a photosensitive gel; wherein the gel layer is a thermosetting gel layer or a viscous material layer.

Embodiment 7: The manufacturing method of Embodiment 1, the transient base including a supporting portion and a gap, wherein the supporting portion provides a place to lay the first end, and the existing of the gap causes the first end remaining movable after being placed on the supporting portion.

Embodiment 8: The manufacturing method of Embodiment 1, the transient base is a movable base, a hinge or a movable element.

Embodiment 9: A method of manufacturing a micro normally-closed structure, including: providing a flexible arm, a movable base and a fixed contact, wherein the flexible arm including a first end and a movable contact, the movable base provides an electrically movable connection to the first end, wherein the position of the movable contact is corresponding to the fixed contact; and generating an electrically conducting state between the movable contact and the fixed contact, in which anchoring the transient base to fix the first end to the position of the movable base to remain the electrically conducting state.

Embodiment 10: A micro normally-closed structure, which manufactured through a MEMS process and used as a MEMS component, including: a base and a fixed contact; and a flexible arm including a first end and a movable contact, wherein the first end is electrically connecting to the base, and remaining a normally closed electrically conducting state between the movable contact and the fix end.

While the disclosure has been described in terms of what are presently considered to be the most practical and preferred embodiments, it is to be understood that the disclosure need not be limited to the disclosed embodiments. On the contrary, it is intended to cover various modifications and similar arrangements included within the spirit and scope of the appended claims, which are to be accorded with the broadest interpretation so as to encompass all such modifications and similar structures. Therefore, the above description and illustration should not be taken as limiting the scope of the present disclosure which is defined by the appended claims.

What is claimed is:

1. A method for manufacturing a micro normally-closed structure, comprising:
    providing a flexible arm, and a transient base and a fixed contact separated from the flexible arm, wherein the flexible arm is free to move and includes a first end configured at one terminal and a movable contact configured at another terminal, the transient base is configured at where corresponds to the first end, and the fixed contact is located at the movable contact;
    forming a temporary electrical connection between the first end and the transient base by filling the transient base with a liquid metal, and applying a gel layer to cover where the temporary electrical connection is formed;
    forming a temporary electrical conduction between the movable contact and the fixed contact by applying an external magnetic field to the flexible arm to move the flexible arm to make the movable contact touch the fixed contact;
    maintaining the temporary electrical connection and the temporary electrical conduction; and
    securing the first end to the transient base permanently which causes the temporary electrical connection turn into a permanent electrical connection and the temporary electrical conduction turn into the micro normally-closed structure.

2. The method according to claim 1, further comprising the steps as follows:
    securing the first end to the transient base permanently by gel layer to anchor the first end to the transient base.

3. The method according to claim 1, further comprising the steps as follows:
    forming the temporary electrical conduction between the movable contact and the fixed contact by applying an external magnetic field to the flexible arm to move the flexible arm to make the movable contact touch the fixed contact;
    forming the temporary electrical connection between the first end and the transient base by wiring the first end and the transient base to electrically connect the first end and the transient base, and applying the gel layer to cover where the temporary electrical connection is formed; and
    securing the first end to the transient base permanently by the gel layer to anchor the first end to the corresponding position of the transient base.

4. The method according to claim 2, wherein the liquid metal is one selected from a group consisting of Galinstan, mercury or a combination thereof.

5. The method according to claim 1, wherein the gel layer is one selected from an ultraviolet radiation sensitive gel and a thermosetting gel.

6. The method according to claim 1, wherein the transient base includes a supporting portion and a gap, wherein the supporting portion provides a space to lay the first end, and the existence of the gap causes the first end to be movable after being placed on the supporting portion.

7. The method according to claim 1, wherein the transient base is a hinge.

* * * * *